(12) United States Patent
Degen

(10) Patent No.: US 10,908,029 B2
(45) Date of Patent: Feb. 2, 2021

(54) VOLTAGE AND TEMPERATURE MONITORING IN POWER SUPPLIES

(71) Applicant: NXP B.V., Eindhoven (NL)

(72) Inventor: Peter Theodorus Johannes Degen, Arnhem (NL)

(73) Assignee: NXP B.V., Eindhoven (NL)

( * ) Notice: Subject to any disclaimer, the term of this patent is extended or adjusted under 35 U.S.C. 154(b) by 384 days.

(21) Appl. No.: 15/860,340

(22) Filed: Jan. 2, 2018

(65) Prior Publication Data
US 2019/0204161 A1 Jul. 4, 2019

(51) Int. Cl.
| | | |
|---|---|---|
| G01K 1/00 | (2006.01) | |
| G01K 13/00 | (2006.01) | |
| G01K 7/00 | (2006.01) | |
| G01K 7/18 | (2006.01) | |
| H02M 7/217 | (2006.01) | |
| G01R 19/165 | (2006.01) | |
| G01R 17/02 | (2006.01) | |
| H02M 1/42 | (2007.01) | |
| G01R 19/32 | (2006.01) | |
| G01R 31/40 | (2020.01) | |

(52) U.S. Cl.
CPC ............... *G01K 7/18* (2013.01); *G01R 17/02* (2013.01); *G01R 19/165* (2013.01); *G01R 19/32* (2013.01); *G01R 31/40* (2013.01); *H02M 1/4258* (2013.01); *H02M 7/217* (2013.01)

(58) Field of Classification Search
USPC ..................... 374/152, 141, 142, 183, 178
See application file for complete search history.

(56) References Cited

U.S. PATENT DOCUMENTS

| | | |
|---|---|---|
| 9,521,712 B1 | 12/2016 | Melanson et al. |
| 2006/0093016 A1* | 5/2006 | McLeod ............... G01K 7/01 374/178 |
| 2010/0259313 A1 | 10/2010 | Li et al. |
| 2013/0121044 A1 | 5/2013 | Gao et al. |
| 2013/0301302 A1 | 11/2013 | Wu et al. |

OTHER PUBLICATIONS

NXP; "TEA1833TS—GreenChip SMPS control IC—rev. 1"; Product Data Sheet; 25 pages (Aug. 31, 2015).
NXP; "TEA19162T—PFC controller—Rev. 1"; Product data sheet; 30 pages (Mar. 10, 2016).

* cited by examiner

*Primary Examiner* — Mirellys Jagan

(57) ABSTRACT

A device for measuring voltage and temperature in a power supply is disclosed. The device includes a pin to be coupled to a temperature measuring circuit and power inputs of the power supply. The device is configured to measure a voltage at the power inputs and when the voltage changes are within a predetermined threshold for a predetermined time period, the device is configured to measure the temperature.

20 Claims, 3 Drawing Sheets

VOLTAGE AND TEMPERATURE MONITORING IN POWER SUPPLIES

BACKGROUND

Power supplies are used virtually in every electronic device primarily for converting alternate current (AC) electrical input that may be vary in voltage due to power line conditions and load factors into a constant direct current (DC) output to power the internal circuitry of the electronic device.

Typically, internal components of an electronic device may be sensitive to a maximum value of current that can pass through them. If the current exceeds a certain threshold, an electronic component may get burned or may not function as per its specification. Therefore, it is desired to limit the amount of current that can flow through the component to the allowable current ratings for that component. The amount of current flowing through the components of a power supply may increase if the input AC voltage decreases. If the input voltage decreases but the power being drawn from the power supply remain constant, the current will increase according to P=V*I, where V is input voltage, I is current.

Further, typically, a capacitor is used at the AC input side of the power supply for filtering. This capacitor retains electrical charge for a brief duration even after the AC input is disconnected from the AC mains. The length of the charge retention may be related to the capacitance value of the capacitor. To protect users from electrical shock, this capacitor needs to be quickly discharged as soon as the power supply is disconnected from the AC mains. Therefore, it is desirable to continuously monitor the voltage at AC inputs of the power supply.

In addition, if external temperature increases beyond the ratings of electronic components, the component may not function as per their stated specifications. Therefore, it is desirable to monitor external temperature.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a device for measuring voltage and temperature in a power supply is disclosed. The device includes a pin to be coupled to a temperature measuring circuit and power inputs of the power supply. The device is configured to measure a voltage at the power inputs and when the voltage changes are within a predetermined threshold for a predetermined time period, the device is configured to measure the temperature.

In another embodiment, device for measuring voltage and temperature in a power supply is disclosed. The device includes a pin to be coupled to a temperature measuring circuit and power inputs of the power supply. The device further includes a first current source internally coupled to the pin, a second current source coupled to a switch and the switch internally coupled to the pin, a first comparator internally coupled to the pin and a first reference voltage source producing a first voltage reference, a second comparator internally coupled to the pin and a second voltage reference source producing a second voltage reference and a controller coupled to an output of the first comparator and a tracking register. The tracking register is coupled to the first current source.

In some embodiments, the controller is configured to increment a value in the tracking register when the voltage at the pin exceeds the first voltage reference. A current generated by the first current source corresponds to the value stored in the tracking register. The second reference voltage is higher than the first reference voltage and the controller is configured to measure a rate of current acceleration flowing through the pin. The controller is configured to turn on the switch when the rater of current acceleration is below a selected threshold, at which time a current flowing through the pin is equalized by a current produced by the first current source. The second comparator produces a control signal to indicate over temperature when a voltage at the pin remains below the second reference voltage. The controller is configured to keep a voltage at the pin equal to the first reference voltage by altering a value of current produced by the first current source. The temperature measuring circuit includes a diode and a negative temperature coefficient (NTC) resistor. In some examples, when the measured current via the tracking register is not increasing within a predetermine time period, the controller is configured to generate a signal to turn on a capacitor discharge switch that couples a input mains capacitor to ground, to discharge the input mains capacitor.

In another embodiment, a method for measuring a voltage and a temperature using a same pin of a control chip in a power supply is disclosed. The method includes tracking voltage at the pin and producing a reverse current using a first current source and inputting the produced current to the pin to keep a voltage at the pin at a first reference voltage. When a rate of acceleration of a current through the pin falls below a selected threshold, a switch is turned on to connect a second current source to the temperature measuring circuit. The method further includes measuring a voltage at the temperature measuring circuit and inputting the measured voltage to a voltage comparator coupled to a second voltage reference to produce an over temperature signal.

In some examples, the over temperature signal is produced when the measured voltage remains below the second voltage reference and the tracking includes using a voltage comparator coupled to the first reference voltage and the pin and to increment a register when the voltage at the pin exceeds the first reference voltage. The reverse current corresponds to a value stored in the register. The second voltage reference is higher than the first voltage reference. The temperature measuring circuit includes a negative temperature coefficient (NTC) resistor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in details in the description so as not to obfuscate the present disclosure.

In order to protect components of a device and its users, the power supply that supplies power to the components from AC mains needs to be turned off (or protective measures needs to be taken) when adverse conditions arise. Adverse conditions may include the voltage at AC mains dropping below a selected threshold or external temperature rising beyond a selected threshold.

Technologies exists to monitor voltage at AC mains and external temperature in power supplies. In some technologies, two separate pins are used at a control chip to input voltage and temperature. Using two pins at the control chip increases the cost of manufacturing the control chip. It may also increase the complexity of using the control chip in a circuit as two separate wiring paths need to be created. In some other technologies, only one pin is used. However, the monitoring of the voltage is performed in one half cycle of the AC input wave while the temperature is monitoring during the other half cycle of the AC input wave. Measuring voltage in one cycle may be found deficient because a sudden change in the AC input voltage may occur when the temperature is being measured.

The embodiments described herein addresses the drawbacks of existing technologies. The embodiments described herein uses only one pin at the control chip for inputting both voltage and temperature measurements and the voltage is measured substantially continuously while temperature is measured for a very brief period during an AC wave cycle. In some embodiments, the control chip is configured to measure temperature after every preselected number of AC cycles.

Figure 1:
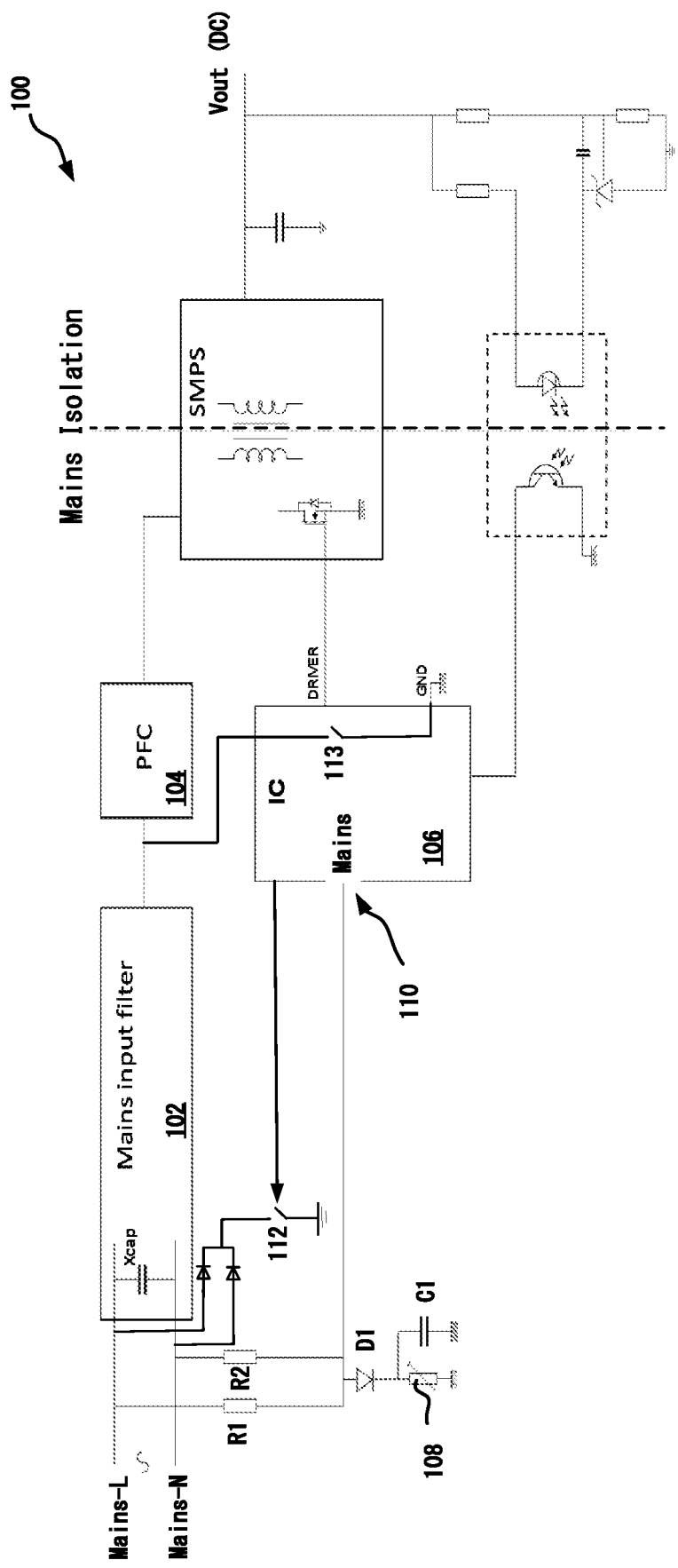
FIG. 1 depicts a schematic diagram of a power supply with a control chip to monitor both voltage and temperature using a same pin in accordance with one or more embodiments of the present disclosure.

FIG. 1 depicts a schematic diagram of a power supply 100 with a control chip 106 to monitor both voltage and temperature using one pin. In the following description, only parts of the power supply 100 that are relevant to the present disclosure are being described so as not to obfuscate the embodiments described herein. The parts that are not being described herein are well understood to a person skilled in the art.

The power supply 100 includes ports for receiving input AC power from AC mains Mains-L, Mains-N. Voltage at AC mains may vary from country to country and also depending on variations in load during the use of the power supply 100. AC mains may deliver power that includes disturbances and the voltage may fluctuate due to power line or load conditions. A mains input filter 102 is included to clean the input waveform of AC mains. The mains input filter 102 includes a capacitor Xcap. The capacitor Xcap retains charge for a duration even after AC mains are disconnected. It is a likely scenario that a human may touch Mains-L or Mains-N after disconnecting a device that uses the power supply 100 and since Xcap may still be charged, the human may get electrical shock from touching Mains-L or Mains-N. Therefore, it is required that Xcap is quickly discharged upon being disconnected from AC mains. In order for the control chip 106 to cause a discharge of Xcap when the power supply 100 is disconnected from AC mains, the voltage at AC mains is needed to be monitored either continuously or substantially continuously.

A power factor controller (PFC) 104 is included to reduce the amount of reactive power generated by a device. Reactive power operates at right angles to true power and energizes the magnetic field. Reactive power has no real value for an electronic device. PFC is a required feature for power supplies shipped to many jurisdictions. In power factor correction, the power factor (represented as "k") is the ratio of true power (kwatts) divided by reactive power (kvar). The power factor value is between 0.0 and 1.00. If the power factor is above 0.8, the device is using power efficiently. Typically, a standard power supply has a power factor of 0.70-0.75, and a power supply with the PFC 104 has a power factor of 0.95-0.99.

In case of a switch mode power supply (SMPS), the control chip 106 is configured to control the switching transistors to product a desired DC voltage at Vout. The primary and secondary sides of the power supply 100 are electrically isolated using a transformer. If a communication between the primary and the secondary side is needed (e.g., for synchronization of switching of a primary and a secondary switch), optical means of communication may be used to send and receive signals. The control chip 106 includes a pin 110 for receiving voltage and temperature measurements and the control chip 106 is also configured to switch between measuring voltage and temperature. As shown, only one pin 110 is used for both voltage and temperature measurements.

The power supply 100 may include two resistors R1, R2 coupled to Mains-L and Mains-N respectively. The resistors R1, R2 are coupled to a diode D1. The diode D1 is coupled to a capacitor C1 that is also coupled to ground. The diode D1 is also coupled to a negative temperature coefficient (NTC) resistor or thermistors 108. The resistance of the NTC resistor 108 decreases with increasing temperature. Hence, by measuring a voltage across the NTC resistor 108 for a known current flowing through the NTC resistor 108, a temperature may be derived. The power supply 100 may include a capacitor discharge switch 112 coupled to Mails-L and Mains-N on one side and to the ground on the other side. When $X_{cap}$ needs to be discharged quickly upon detection of no voltage increase for a predetermined period of time at Mains-L and Mains-N, the control chip 106 generates a control signal to turn on the capacitor discharge switch 112. In some other embodiments, the control chip 106 may include a capacitor discharge switch 113 internally coupled to the output of the mains input filter 102. The switch 113 may be turned on to discharge $X_{cap}$ when Mains-L and Mains-L voltage does not increase for a predetermined period of time.

Figure 2:
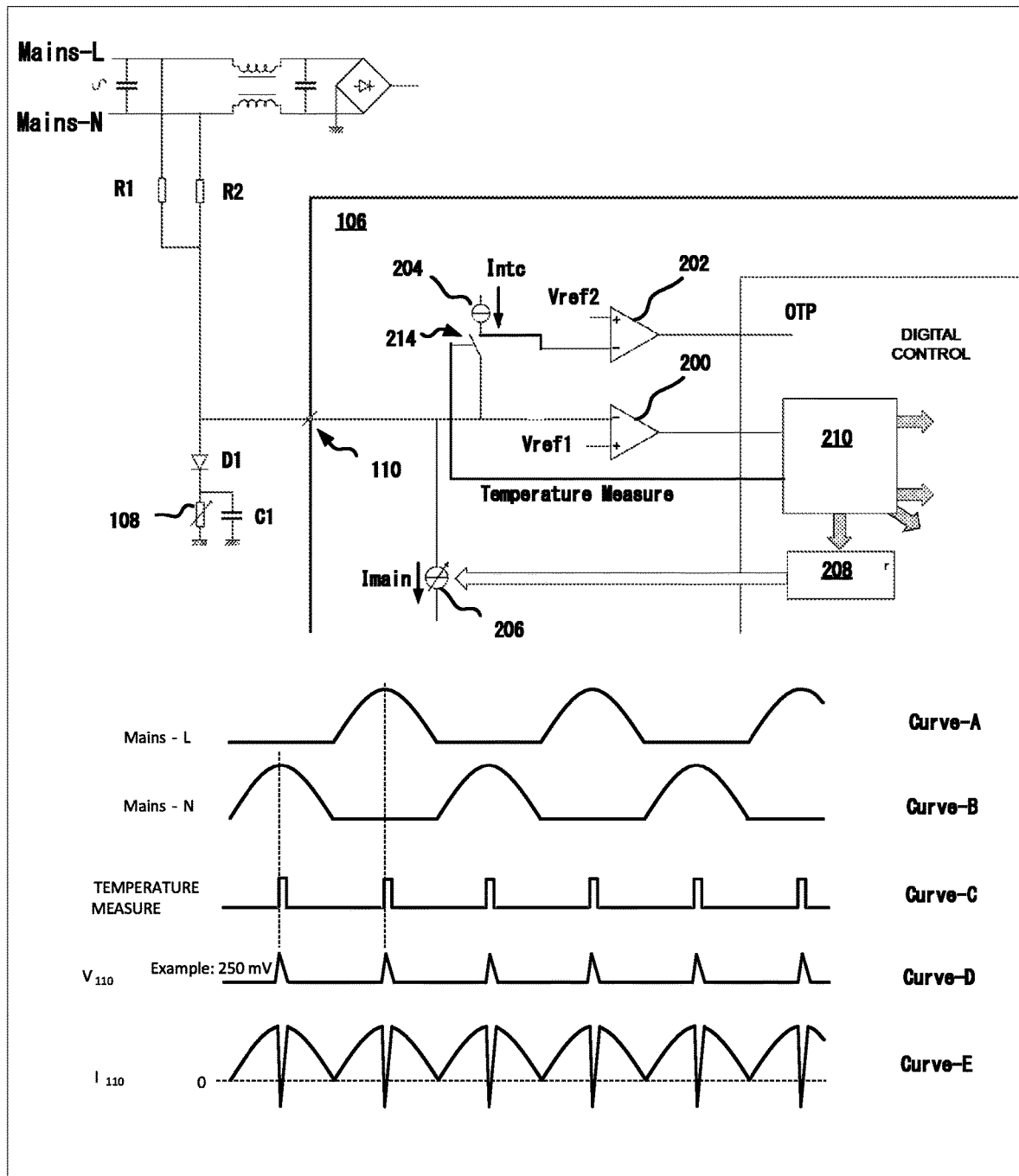
FIG. 2 depicts a schematic of the control chip in accordance with one or more embodiments of the present disclosure.

FIG. 2 depicts a schematic of the control chip 106 as used in the power supply 100. The control chip 106 includes a first current source 206 and a second current source 204. The first current source 206 delivers a current $I_{main}$ and the second current source 204 delivers a current $I_{ntc}$. A switch 214 is included to couple or decouple the second current source 204 to the NTC resistor 108. The control chip 106 includes a first comparator 200 that is coupled to a first reference voltage $V_{ref1}$ and a second comparator 202 that is coupled to a second reference voltage $V_{ref2}$. In some embodiments, $V_{ref1}$ in the order of 0.25V and $V_{ref2}$ is in the order of 3V while R1 and R2 may be in mega ohms range.

The control chip 106 includes a digital control block that includes a controller 210 that is coupled to a tracking register 208. The controller 210 receives a signal from the first comparator 200 and whenever the second input to the first comparator 200 is higher than $V_{ref1}$, the controller 210 causes the tracking register 208 to increase a count. The count then translates into calibrating the first current source 206, that is the amount of current produced by the first current source 206 corresponds to the value of the count in the tracking register 208.

A current flows from Mains-L and Mains-N through the path of least resistance that includes the resistors R1, R2, the pin 110 and the first current source 206. The first current source 206 and the controller 210 are configured to generate a reverse current to keep a voltage at the pin 110 to approximately equal to $V_{ref1}$. Whenever the current through the pin 110 increases due to variations (sine wave AC input varies with time and also the amplitude of the sine wave may fluctuate) in the input AC voltage at Mains-L and Mains-N, the voltage at the pin 110 also increases and cause the controller 210 to re-calibrate the first current source 206 to output proportionately increased current to keep the voltage at the pin 110 back to $V_{ref1}$. In other words, the controller 210 is configured to track the current at the pin 110 and generate an amount of reverse current through the first current source 206 to keep the voltage at the pin 110 at $V_{ref1}$ as shown in Curve-D.

Since AC input voltage at Mains-L and Mains-N is a sine wave, at the vertices of the sine wave, the rate of acceleration or deacceleration of rise or fall in voltage goes below a selected threshold. Depending upon the actual shape of the input AC sine wave (e.g., the peaks are relatively flat for a brief duration), the rate of acceleration or deacceleration may become constant at the peaks of the sine wave for a brief period of time. The controller 210 tracks the acceleration or deacceleration of the voltage at the pin 110 and when the rate either becomes constant or falls below the selected threshold, the controller 210 turns on the switch 214 through Temperature Measure control signal to enable the second current source 204 to be electrically connected to the pin 110, the diode D1 and the NTC resistor 108 and keeps the current source 206 to a predetermined value such that the output current produced by the first current source 206 does not change anymore depending on the value of the first comparator 200. Since the current at the pin 110 from AC mains is compensated by the reverse current produced by the first current source 206, the current produced by the second current source 206 flows through the electrical path that includes the diode D1 and the NTC resistor 108. The voltage at the pin 110 then corresponds to the voltage drop across the NTC resistor 108 and the diode D1. It should be noted that the value of the NTC resistor 108 varies with the temperature in the proximity of the NTC resistor 108. If the voltage at the pin 110 when the switch 214 is on remains below $V_{ref2}$ for a predetermined period time (e.g., 50 us) the second comparator 202 produces an over temperature signal (OTP) to indicate that the temperature is above a selected threshold. The selected threshold for the temperature may be calibrated by altering $V_{ref2}$. In some embodiments, the switching of the switch 214 may be performed once every selected number of AC input sine wave cycles. When the second current source 204 is connected to the pin 110 via the switch 214, the voltage at the pin 100 is $I_{ntc}$ (current through the NTC resistor 108)*$R_{ntc}$ (resistance of the NTC resistor 108)+ $V_{diode}$ (voltage drop across the diode D1). As at higher temperatures when $R_{ntc}$ reduces, the voltage at the pin 110 also reduces. Therefore, when the voltage at the pin 110 exceeds $V_{ref2}$, it is indicative of that the temperature is still below a threshold level. In some examples, if the voltage at the pin 110 remains below $V_{ref2}$ for a predetermined time, the system signals an OTP detection.

In one or more embodiments, the temperature measurement is an absolute temperature measurement in that the measuring of the temperature only includes determining if the temperature is above or below the selected threshold and if the temperature is above the selected threshold, a control signal OTP is generated and the OTP signal can be used to turn the power supply 100 off, at least for a certain period of time until a next temperature reading is below the selected threshold.

In some embodiments, when the switch 214 is kept "on" when the OTP signal is triggered so that the temperature continued to be monitored and if the temperature goes below the selected threshold, the voltage at the pin 110 goes below $V_{ref2}$ and causing the OTP signal to revert to "off" state. In some other embodiments, the temperature is only measured during the peaks of the mains sine wave and the switch is not kept "on" after sensing the temperature. If the voltage at the pin 110 remains below $V_{ref2}$, then the OTP signal is generated and when the voltage at the pin 110 increases $V_{ref2}$ the OTP signal is off.

In some examples, the switch 214 may be turned on to measure the temperature when the AC input sine wave is crossing zero or near zero instead at the peaks of the sine wave as stated above.

Kirchhoff's circuit laws states that the sum of all currents at a node is zero. When the current source 204 is turned on at the peak of the mains sine wave while at the same time the current from Mains-L and Mains-L (mains), flowing via either R1 or R2, is compensated by the first current source 206 and the current generated by the second current source 204 flows through the NTC resistor 108 and the diode D1.

As stated above, the current from the mains (via either R1 or R2) towards the pin 110 is compensated by the second current source 206, immediately before the switch 214 is turned on so that at the pin 110, the value of current towards the NTC resistor 108 is equal to the value of current produced by the second current source 204. In practice, even if the current from the mains is not fully compensated by the second current source 206, the temperature measurement can still be accomplished by turning the switch 214 on. Hence a small current at the pin 110 on $I_{main}$ path will not substantially affect the temperature measurement. The value of $V_{ref2}$ is chosen higher to assure that the diode D1 is conducting when measuring the voltage at the NTC resistor 108 and is not conducting when measuring the mains voltage.

Curve-A depicts AC input sine wave at Mains-L and Curve-B shows AC input sine wave at Mains-N. Curve-C shows that the Temperature Measure control signal is generated by the controller 210 to turn the switch 214 on for a brief period of time with respect to the overall width of the half cycle shown in Curve-A and Curve-B Curve-D is the voltage at the pin 110 and Curve-E is the current through the pin 110. As shown, the current at the pin 110 tracks the voltage rise and fall of the sine waves depicted in Curve-A and Curve-B except when the Temperature Measure control signal is on. At that point, the current flowing from AC mains is either equal or substantially equal to the current produced in other direction by the first current source 206 and the current produced by the second current source 204 is the only current that is flows through the diode D1 and the NTC resistor 108.

In some examples, when the switch 214 is off and the mains input voltage, measured via the external resistors R1/R2, the first current source 206 and the tracking register 208, does not increase within a specified time frame, the control chip 106 is configured to produce a signal that turns on the capacitor discharge switch 112 or 113 depending on the embodiment.

Figure 3:
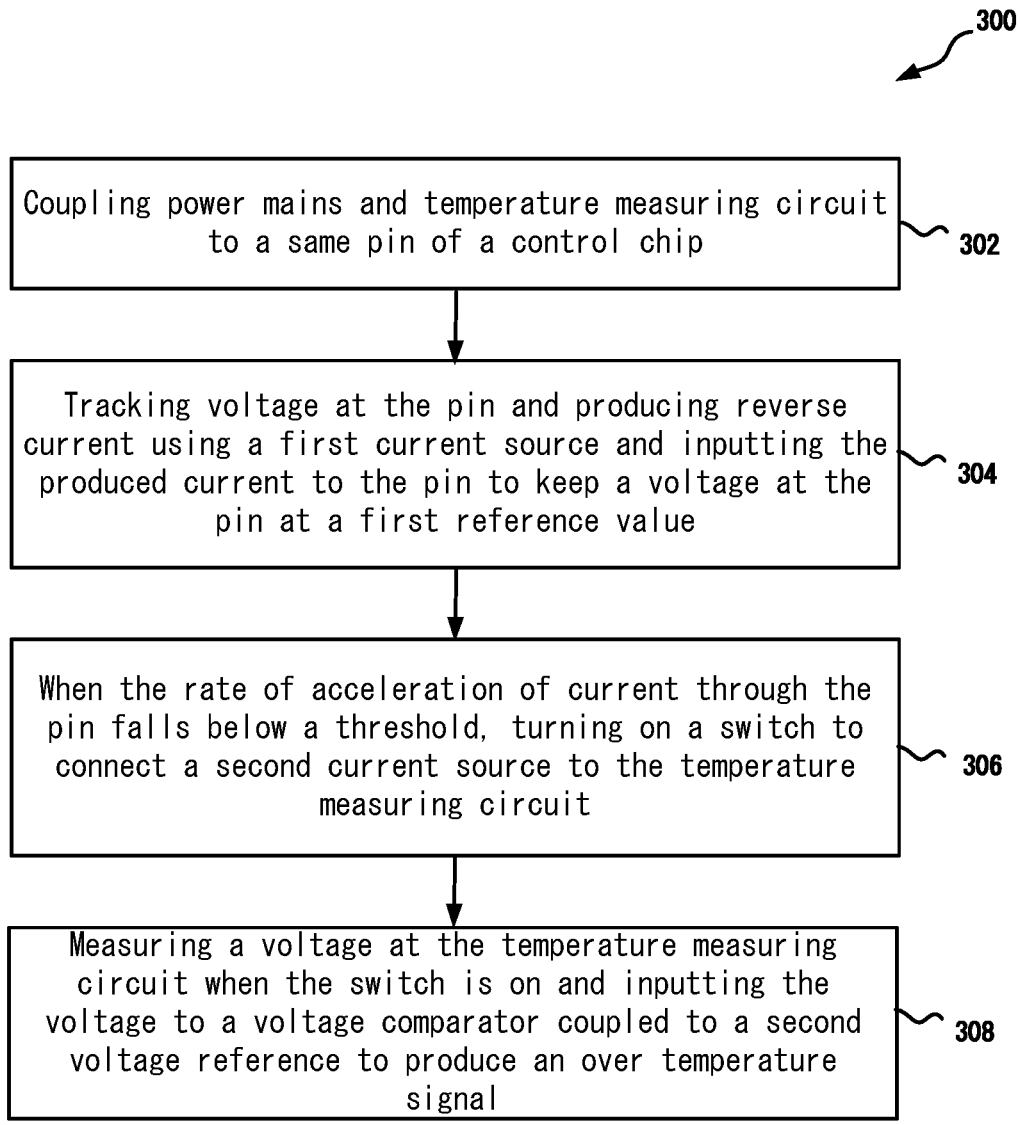
FIG. 3 illustrates a method for measuring voltage and temperature using a same pin of a control chip in accordance with one or more embodiments of the present disclosure.

FIG. 3 illustrates a method 300 for measuring voltage and temperature using a same pin of a control chip. Accordingly, at step 302, the power mains of a power supply are coupled to the pin. The same pin is also coupled to a temperature measuring circuit. In some embodiments, the temperature measuring circuit includes a diode and a negative temperature coefficient (NTC) resistor. At step 304, tracking voltage at the pin and producing reverse current using a first current source and inputting the produced current to the pin to keep a voltage at the pin at a first reference value. At step 306, through the tracking, when it is determined that the rate of acceleration of current through the pin has fallen below a threshold, turning on a switch to connect a second current source to the temperature measuring circuit through the pin. The current delivered by the first current source 206 is then kept at a predetermined value to compensate for the current flowing from the mains via R1/R2 towards the pin 110. At step 308, measuring a voltage at the temperature measuring circuit when the switch is on and inputting the measured voltage to a voltage comparator coupled to a second voltage reference to produce an over temperature signal when the measured voltage remains below the second voltage reference for a predetermined period of time.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A device for measuring voltage and temperature in a power supply, the device comprising:
   a pin to be coupled to a temperature measuring circuit and power inputs of the power supply;
   a first current source internally coupled to the pin;
   a second current source coupled to a switch that is internally coupled to the pin;
   a first comparator internally coupled to the pin and a first reference voltage source producing a first voltage reference;
   a second comparator internally coupled to the pin and a second reference voltage source producing a second voltage reference; and
   a controller coupled to an output of the first comparator and a tracking register, wherein the tracking register is coupled to the first current source.

2. The device of claim 1,
   the second voltage reference is higher than the first voltage reference.

3. The device of claim 1,
   wherein the second comparator produces a control signal to indicate over temperature when a voltage at the pin remains below the second voltage reference for a period of time.

4. The device of claim 1,
   wherein the controller is configured to keep a voltage at the pin equal to the first voltage reference by altering a value of current produced by the first current source.

5. The device of claim 1,
   wherein the temperature measuring circuit includes a diode and a negative temperature coefficient (NTC) resistor.

6. The device of claim 1,
   wherein when a voltage at the pin is not increasing for a period of time, the controller is configured to generate a signal to turn on a capacitor discharge switch that couples an input mains capacitor to ground, to discharge the input mains capacitor.

7. The device of claim 1,
   wherein the controller is configured to increment a value in the tracking register when a voltage at the pin exceeds the first voltage reference.

8. The device of claim 7,
wherein a current generated by the first current source corresponds to a value stored in the tracking register.

9. The device of claim 1,
wherein the controller is configured to measure a rate of current acceleration flowing through the pin.

10. The device of claim 9,
wherein the controller is configured to turn on the switch when the rate of current acceleration is below a selected threshold, at which time a current flowing through the pin is equalized by a current produced by the first current source.

11. A device for measuring voltage and temperature in a power supply, the device comprising
a pin to be coupled to a temperature measuring circuit and power inputs of the power supply,
wherein the device is configured to measure a voltage at the power inputs and when the voltage is within a predetermined threshold for a predetermined time period, the device is configured to measure the temperature.

12. The device of claim 11, comprising:
a first current source internally coupled to the pin;
a second current source coupled to a switch that is internally coupled to the pin;
a first comparator internally coupled to the pin and a first reference voltage source producing a first voltage reference;
a second comparator internally coupled to the pin and a second reference voltage source producing a second voltage reference; and
a controller coupled to an output of the first comparator and a tracking register, wherein the tracking register is coupled to the first current source.

13. The device of claim 12,
wherein the controller is configured to increment a value in the tracking register when a voltage at the pin exceeds the first voltage reference.

14. The device of claim 13,
wherein a current generated by the first current source corresponds to a value stored in the tracking register.

15. A device for measuring a voltage and a temperature using a same pin in a power supply:
wherein the pin is coupled to power inputs of the power supply;
wherein the device is configured to track a voltage at the pin and produce a reverse current using a first current source and input the produced current to the pin to keep a voltage at the pin at a first voltage reference;
wherein the device is configured to turn on a switch to connect a second current source to a temperature measuring circuit when a rate of acceleration of a current through the pin falls below a selected threshold; and
wherein the device is configured to measure a voltage at the temperature measuring circuit and input the measured voltage to a second voltage comparator coupled to a second voltage reference to produce an over temperature signal.

16. The device claim 15,
wherein the over temperature signal is produced when the measured voltage is above the second voltage reference.

17. The device of claim 15,
wherein the second voltage reference is higher than the first voltage reference.

18. The device of claim 15,
wherein the temperature measuring circuit includes a negative temperature coefficient (NTC) resistor.

19. The device of claim 15,
wherein the device is configured to track using a first voltage comparator coupled to the first voltage reference and the pin and to increment a register when the voltage at the pin exceeds the first voltage reference.

20. The device of claim 19,
wherein the reverse current corresponds to a value stored in the register.

* * * * *